United States Patent [19]

Acampora

[11] 4,430,721
[45] Feb. 7, 1984

[54] ARITHMETIC CIRCUITS FOR DIGITAL FILTERS

[75] Inventor: Alfonse Acampora, Staten Island, N.Y.

[73] Assignee: RCA Corporation, New York, N.Y.

[21] Appl. No.: 290,500

[22] Filed: Aug. 6, 1981

[51] Int. Cl.³ ............................................. G06F 15/31
[52] U.S. Cl. .................................................. 364/724
[58] Field of Search ......................................... 364/724

[56] References Cited

U.S. PATENT DOCUMENTS

| | | | |
|---|---|---|---|
| 3,696,235 | 10/1972 | Tufts et al. | 364/724 |
| 3,725,687 | 4/1973 | Heightley | 364/724 |
| 3,949,206 | 4/1976 | Edwards et al. | 364/724 |
| 4,104,729 | 8/1978 | Gingell | 364/757 |

OTHER PUBLICATIONS

Article, "Special-Purpose Hardware for Digital Filtering", by Stanley L. Freeny, Proc. IEEE, vol. 63, pp. 633-648, (Apr. 1975), pp. 63-64.
Article "Two's Complement Pipeline Multipliers", by R. F. Lyon, IEEE, Trans. Commun., vol. COM-24, pp. 418-425, (Apr. 1976), p. 240.
The Advanced Micro Devices Databook on "Schottky and Low-Power Schottky, Bipolar Memory, Logic and Interface", 1975, (beginning on p. 5-19).
Tubiana, "Digital Filter Having Integral Coefficients", IBM Tech. Disc. Bulletin, vol. 18, No. 10, Mar. 1976, pp. 3322-3324.
Moon et al., "A Digital Filter Structure Requiring Only m-Bit Delays, Shifters, Inverters, and m-Bit Adders Plus Simple Logic Circuitry", IEEE Trans. on Circuits and Systems, vol. CAS-27, No. 10, Oct. 1980, pp. 901-908.

Primary Examiner—David H. Malzahn
Attorney, Agent, or Firm—E. M. Whitacre; P. J. Rasmussen; E. P. Herrmann

[57] ABSTRACT

A digital filter is provided which selectively employs binary arithmetic and offset two's complement arithmetic in an adder ladder to protect against signal overflows and underflows, as well as to minimize adder size. Signal overflows and underflows are prevented by performing subtraction and certain additions in offset two's complement notation, while adder sizes are minimized by performing certain other additions in binary notation. In an alternate embodiment, positively weighted values are combined by binary addition in a first adder ladder, and negatively weighted values are combined by binary addition in a second, parallel adder ladder. At the outputs of the two ladders, the two sums are converted to offset two's complement notation, and the negatively weighted sum is subtracted from the positively weighted sum.

11 Claims, 16 Drawing Figures

ARITHMETIC CIRCUITS FOR DIGITAL FILTERS

This invention relates to digital filter circuits and, in particular, to digital filter circuits which may be advantageously used to process digitized television signals without overflow and underflow errors.

In the digital processing of video signals in a television receiver, the detected analog video signal is converted to a digital video signal by an analog to digital converter. The A/D converter will typically provide an output signal quantized over a dynamic range which is substantially equal to the dynamic range of the analog signal. For instance, if the analog signal has a dynamic range of one volt, an 8-bit A/D converter will quantize the signal into 256 possible levels with a resolution of approximately 4 millivolts. Thus a one bit increment is equal to four millivolts. By preserving the dynamic range of the input signal in the conversion process, a maximum amount of picture resolution is retained during digital signal processing.

Once the video signal has been converted to a digital form, it may be separated by comb filtering into its luminance (Y) and chrominance (I and Q) components for further processing. Subsequent processing usually involves digital filtering, such as the low pass filtering conventionally used to separate vertical detail information from the combed chrominance signal. The vertical detail information may then be recombined with the combed luminance signal to develop a fully restored luminance information signal. In addition, an extra measure of detail information may be added back to the combed luminance signal to provide a "peaked" luminance signal. The extra detail information may be controlled in amount by a viewer to produce a picture which is "crisper" than an image with a nominal amount of detail information. However, adding the extra component of detail information to the restored luminance signal may overload the digital processing circuits of the receiver. Even in the absence of intentional peaking, the pulse, or step response of a digital filter may have overshoots which are represented by digital numbers outside the original quantization range. For example, assume that the video signal is at the 250th quantization level. If a peaking signal of a seven level magnitude or greater is added to signal, an 8-bit register containing the signal will overflow, and "wrap around" to a level at the other extreme of the signal range. The signal at the 250th level in this example will be increased by a seven level signal to cause the register to contain a signal at the first level of the signal range; that is, a signal with a value of 11111001 (249), when added to a signal with a value of 111 (seven) will cause the register to assume a value of 000000000, the first level of the 256 level range. The overflow manifests itself in the reproduced image as a sharp transition from black to white, or vice versa, and is visible as a disturbing spot on the television screen. Underflow errors occur in a similar manner when a register jumps from a minimum level to a maximum level.

This overflow or underflow of the register may be prevented, for example, by extending the register by another bit, so that the overflow causes the value 011111001 to go to 100000000. This, however, adds additional cost and complexity to the system, since it is generally necessary to extend the length of subsequent registers also.

Another technique for preventing overflows and underflows is to quantize the signal over a smaller dynamic range than the full range of the A/D converter. For instance, the top thirty levels and bottom thirty levels of the A/D converter may normally be unused to allow subsequent over and underflows into these levels. This techinque, however, limits the dynamic range of the signal at the outset of signal processing, making the technique undersirable.

Finally, overload detectors may be used to detect the occurrence of overflow and underflow conditions. These detectors usually respond to overflows and underflows by clamping the digital signal at a nominal level. The clamped signal will usually be at a gray signal level, which is also visible as a spot in a white or a black picture.

Overflows may also occur in digital filters, in which delayed video signals are weighted and combined to produce a desired response characteristic. It is possible for intermediate signal combinations within the ladder structure used to combine signals to cause the same type of overflows and underflows described above, as registers momentarily wrap around to the other extreme of the dynamic range of the signal. The same protection techinques referred to above may be used in digital filters, with similar drawbacks.

In accordance with the principles of the present invention, a digital filter is disclosed which provides protection against overflows and underflows by centering signals in the middle of the dynamic range of the filter. This is accomplished by inverting the most significant bit of the data words being processed, thereby converting them to offset two's complement form. The data words may be reconverted to binary form by reinverting the most significant bit of each data words. Data words in the system may be reduced in value for the purpose of weighting the words by shifting the data bits through the least significant bit position and replicating the most significant bit in the vacant most significant bit positions of a data register. When two offset two's complement data words in the filter are additively combined, carry-out bits may be ignored without causing underflows or overflows. In a preferred embodiment of the invention, data words in the digital filter which are additively combined are added in either binary or offset two's complement form, and words which are subtractively combined are done so only in offset two's complement form. In accordance with a further aspect of the present invention, positively weighted words are combined in a first ladder network of binary adders, and negatively weighted words are combined in a positive sense in a second ladder network of binary adders. The outputs of the two ladder networks are then converted to offset two's complement form and subtractively combined in a further adder by two's complementing the converted output of the second ladder network. This filter arrangement advantageously requires only a single substraction step at the outputs of the two ladder networks.

Figure 1:
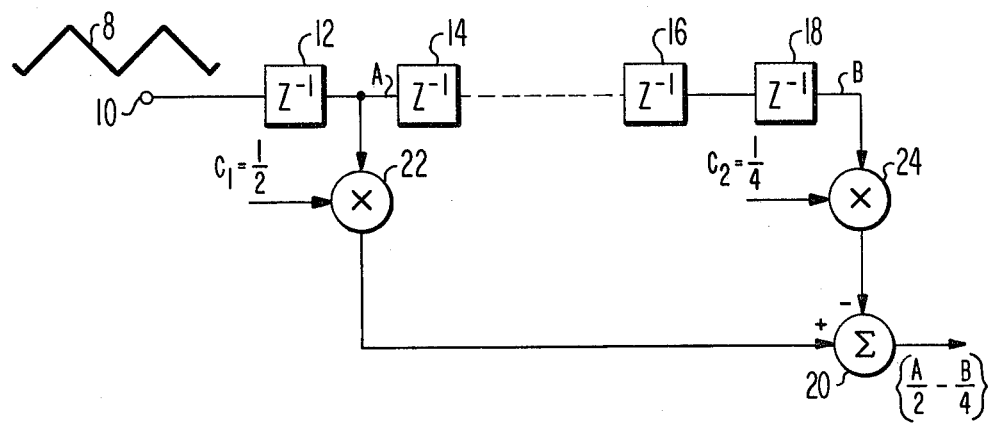
FIG. 1 illustrates in block diagram form a digital filter used to illustrate the principles of the present invention.
Figure 4:
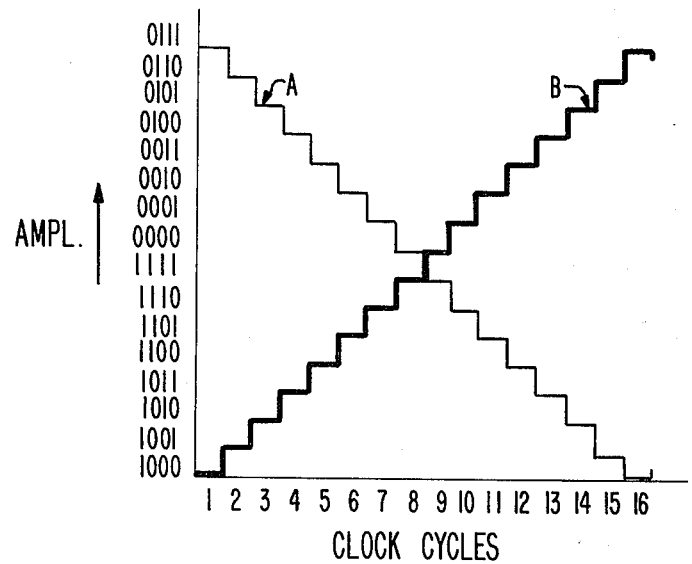
Figure 5:
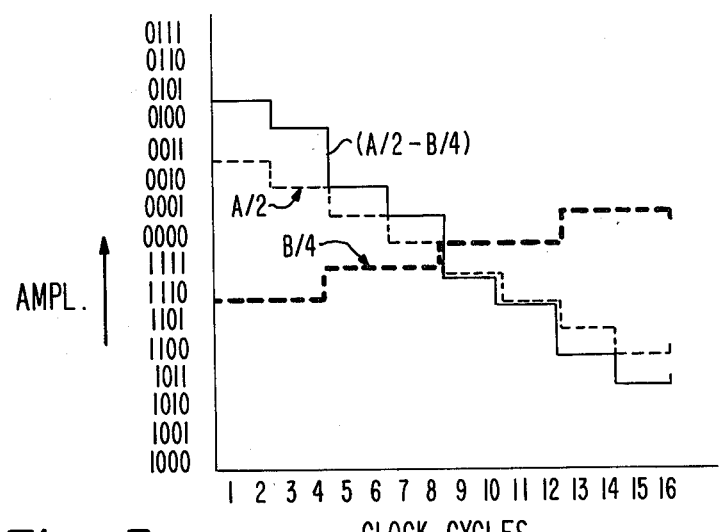
Figure 6:
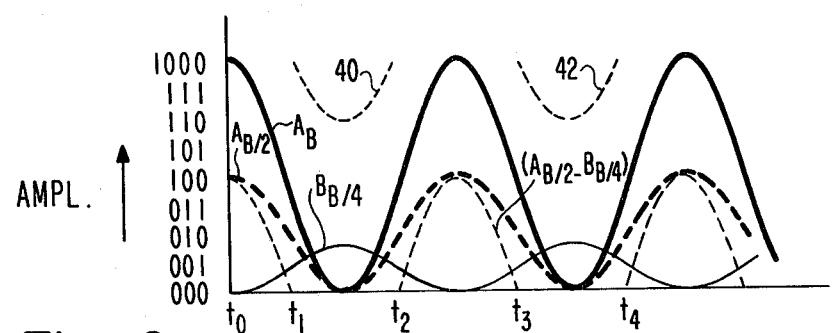
Figure 7:
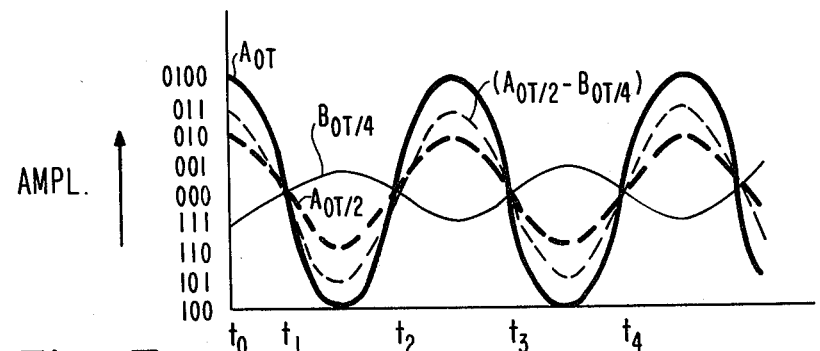
Figure 8:
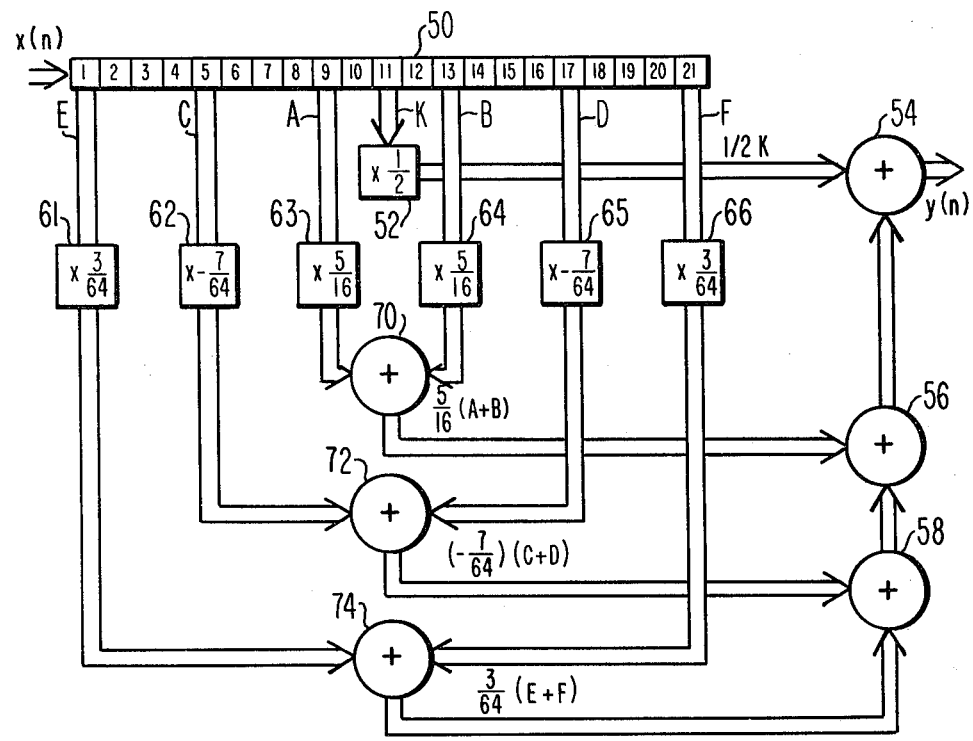
Figure 9:
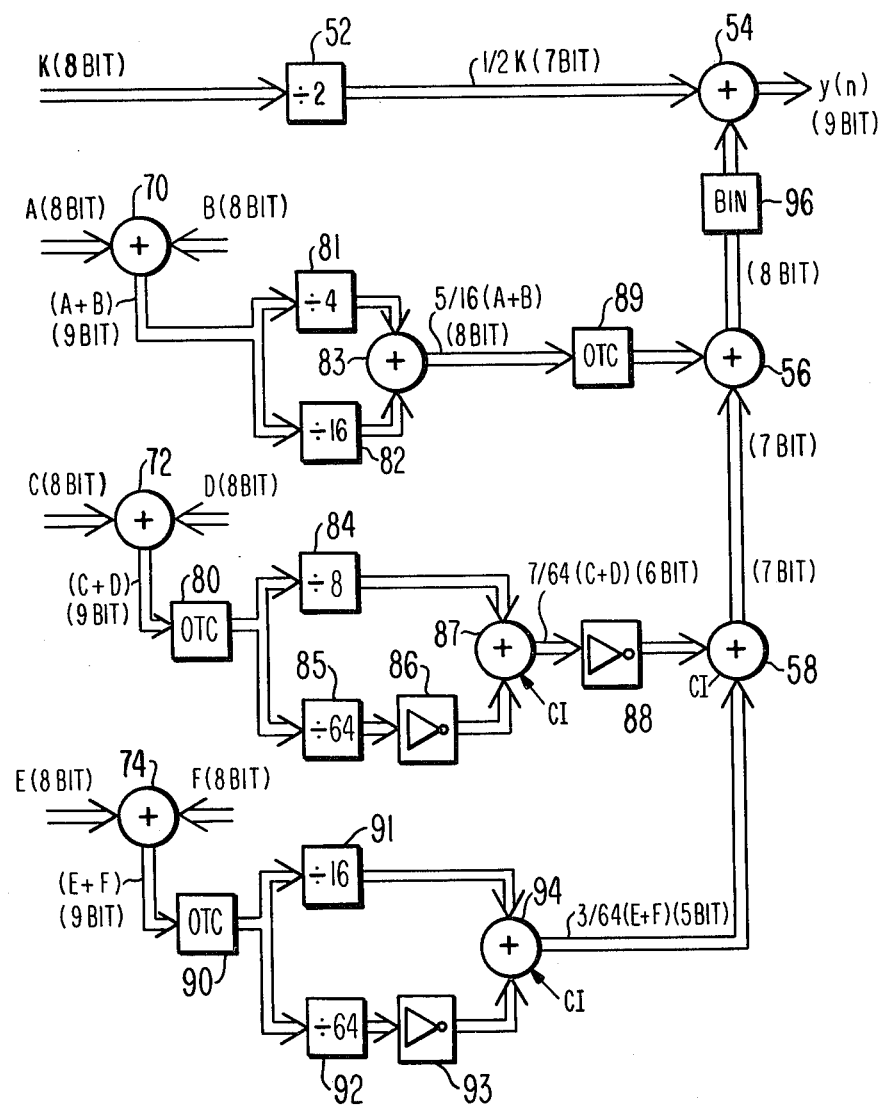
Figure 10A:
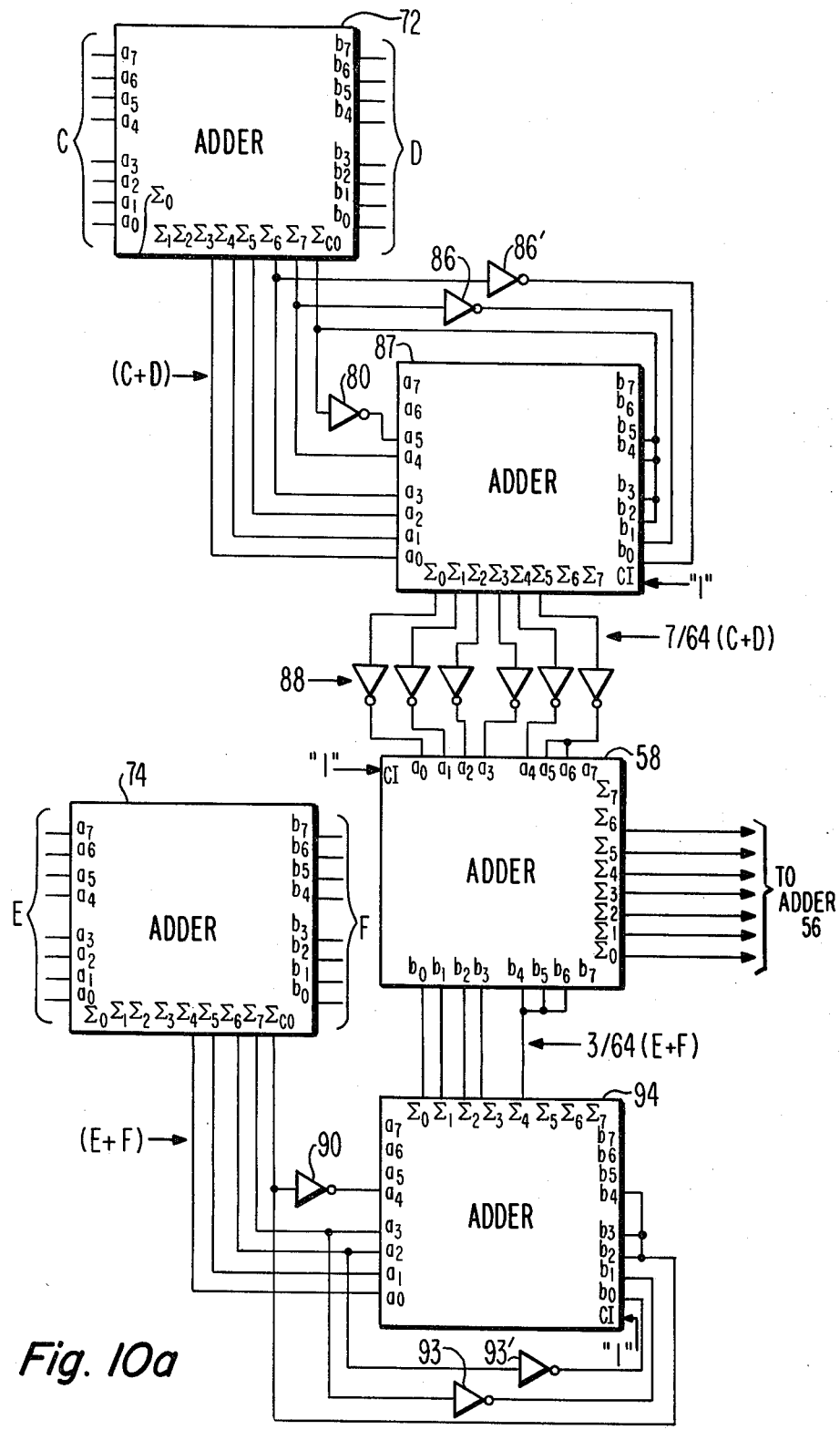
Figure 10B:
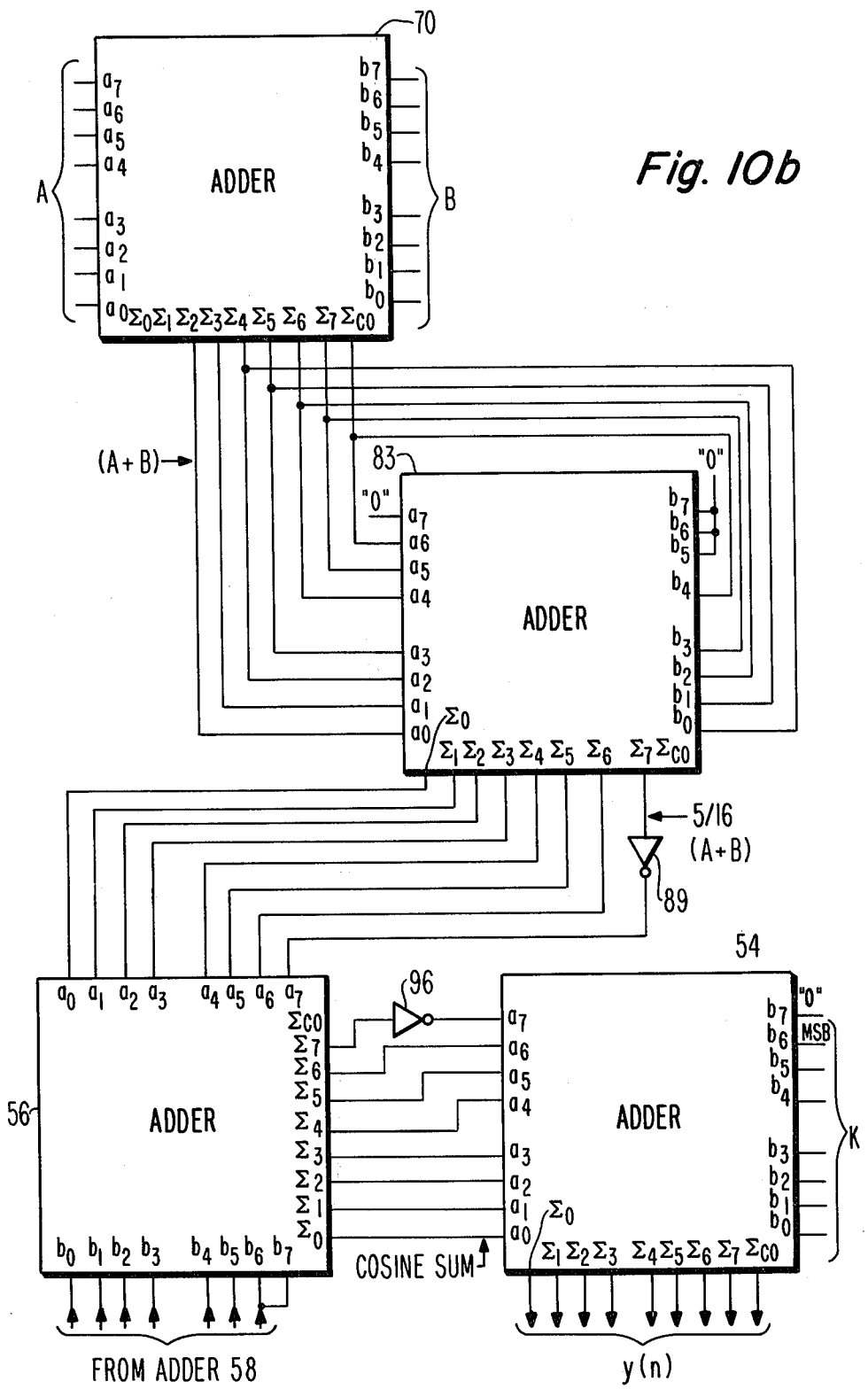
Figure 11:
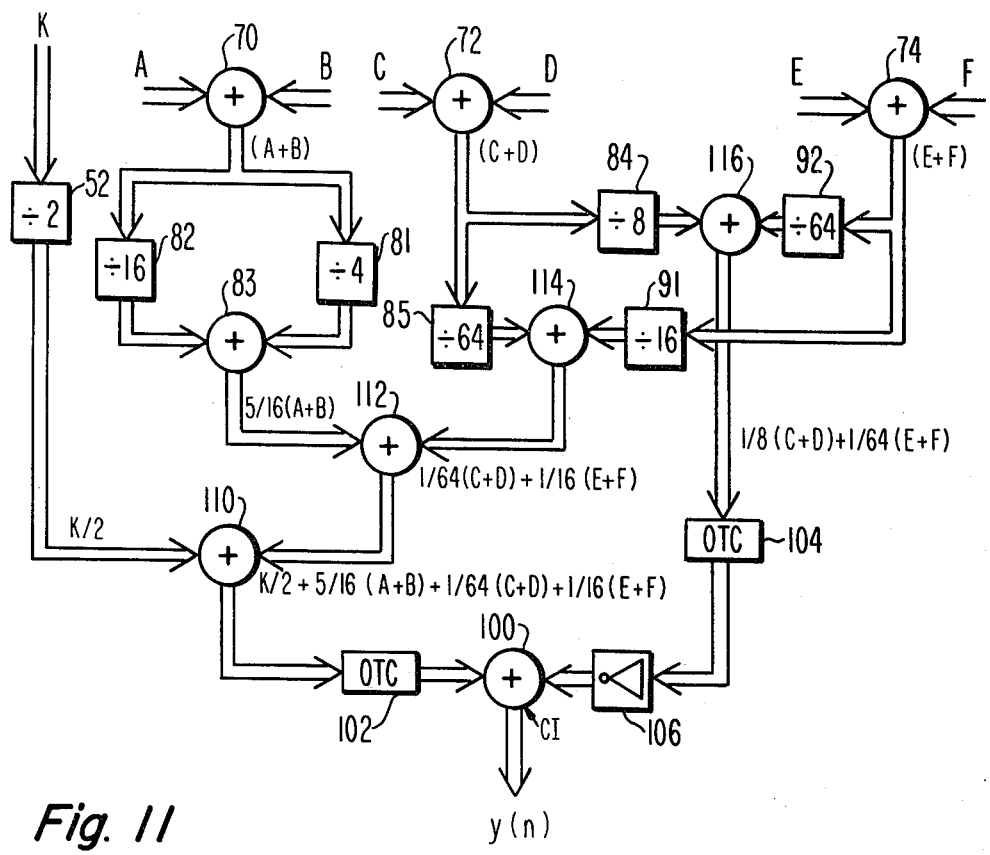
Figure 12A:
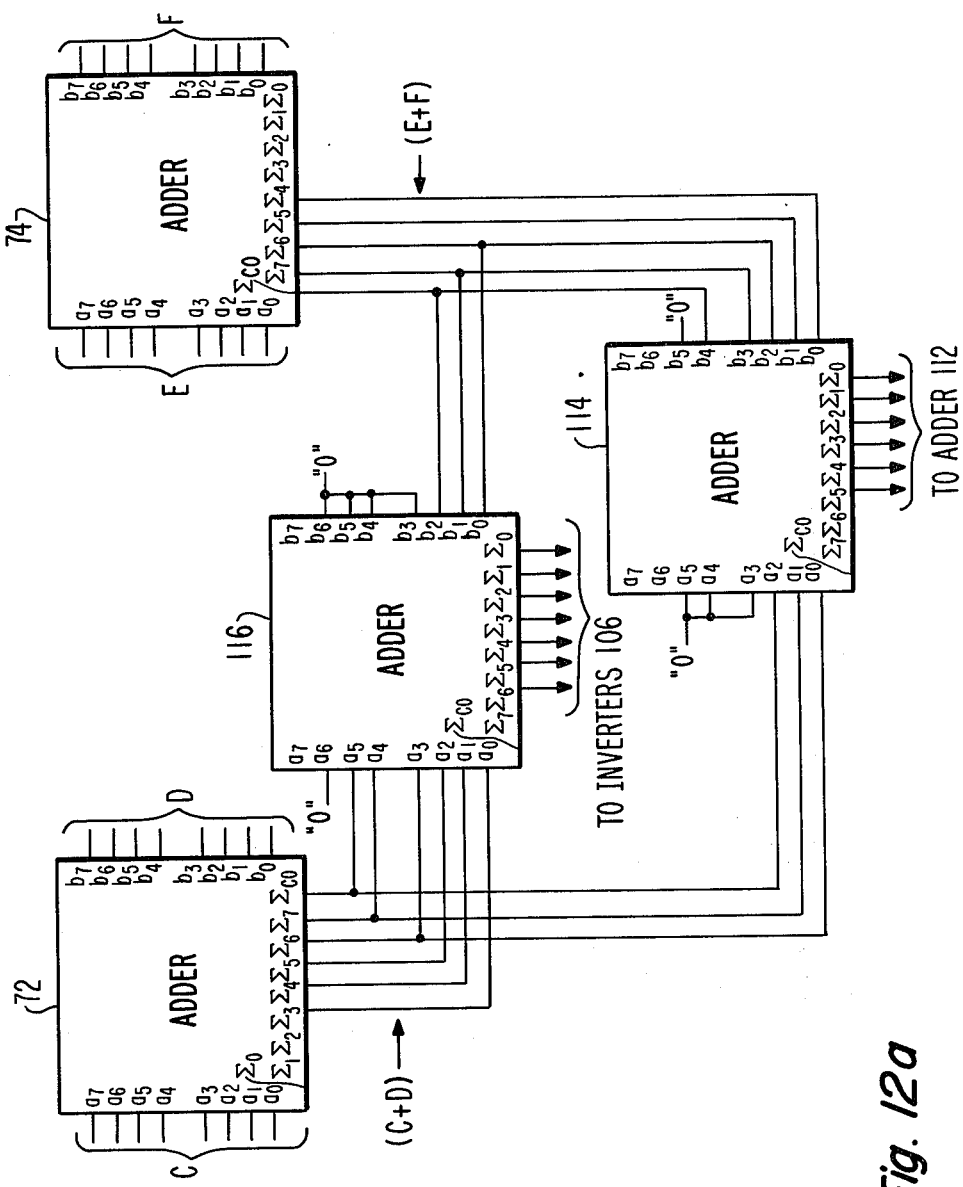
Figure 12B:
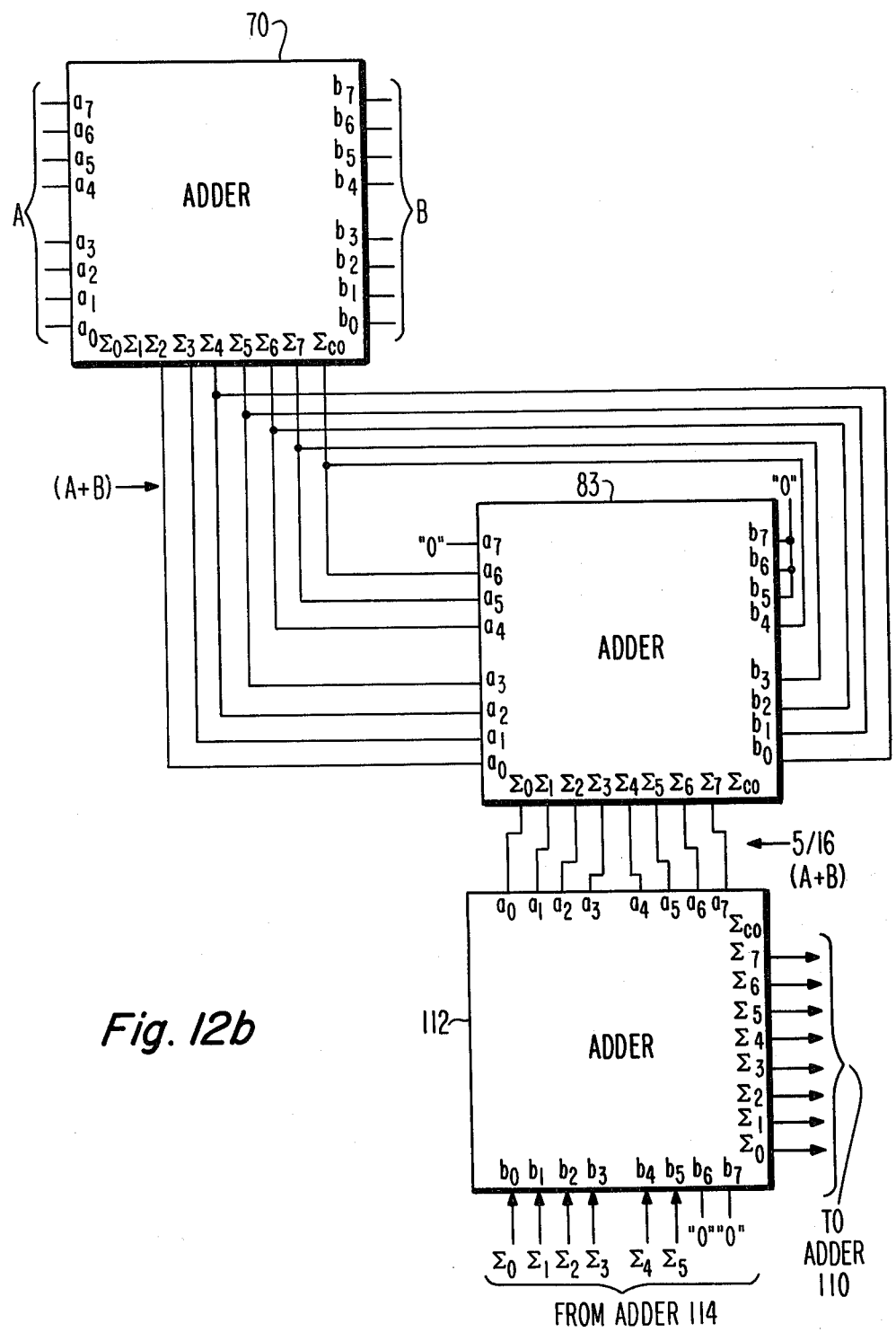
Figure 12C:
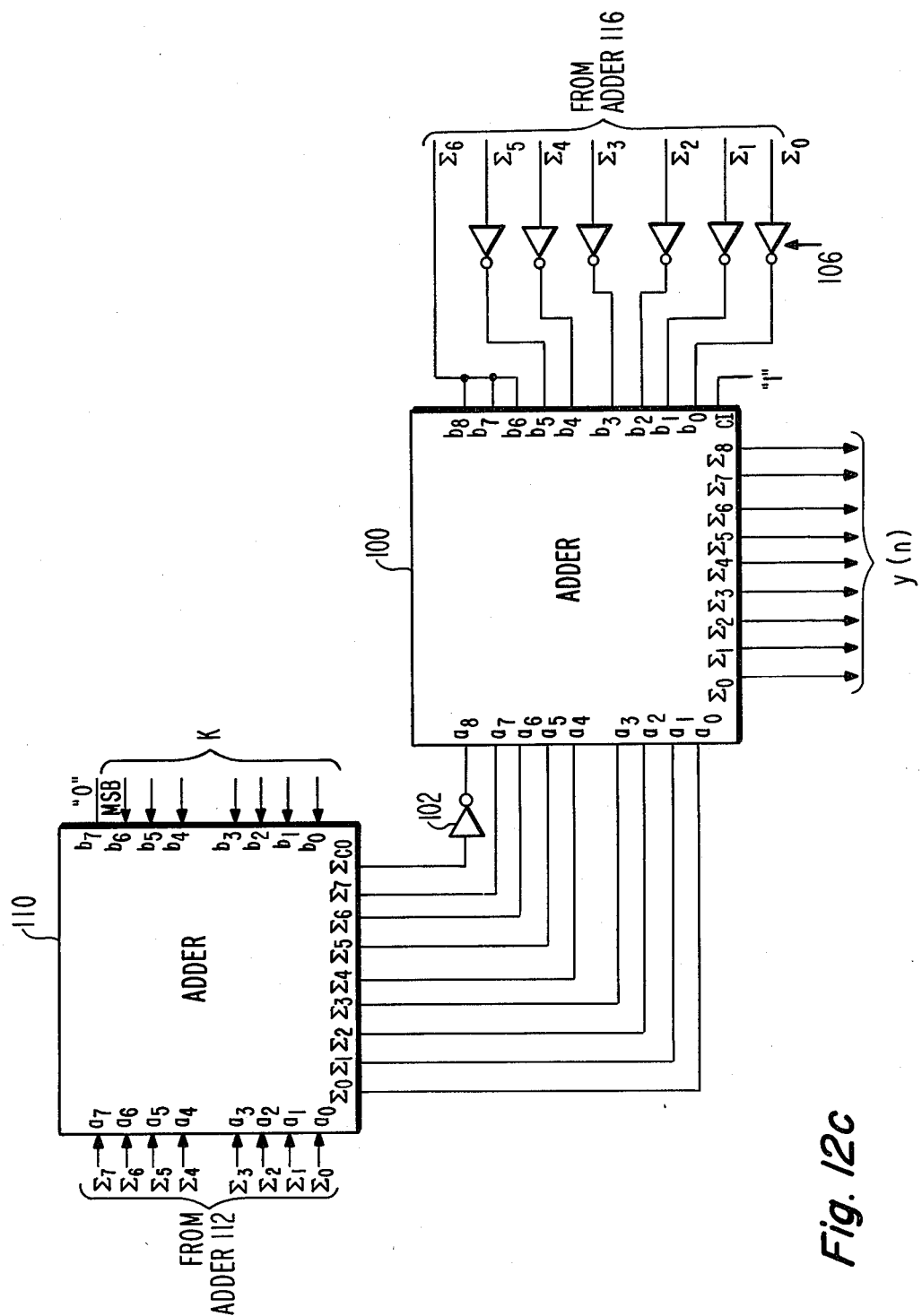
Figure 13:
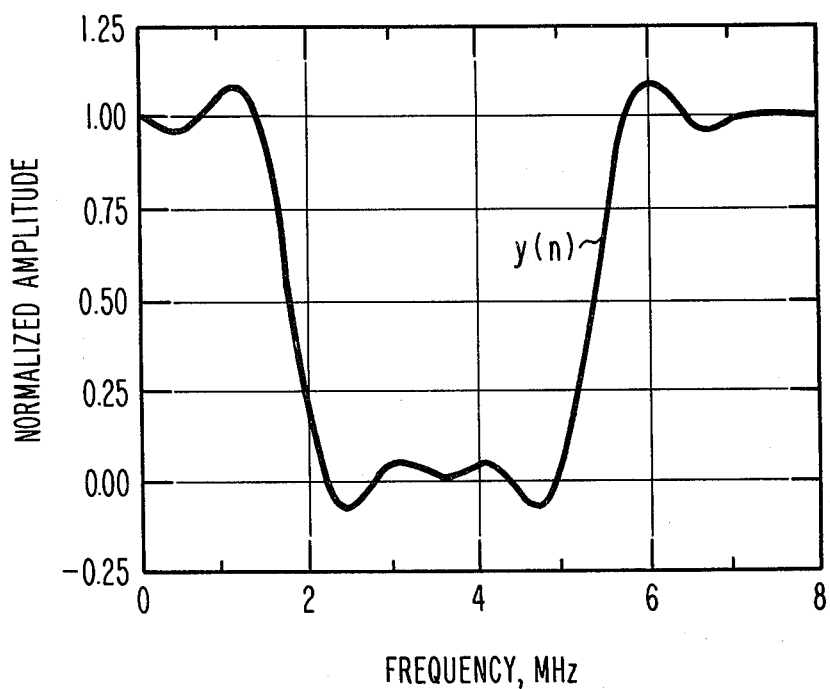

FIGS. 4 and 5 shown waveforms illustrating the operation of the filter of FIG. 1 using data words in which the most significant bit has been inverted;

FIGS. 6 and 7 show sine waveforms illustrating the problem of underflow and its prevention in accordance with the principles of the present invention;

FIG. 8 illustrates in block diagram form a cosine finite impulse response (FIR) filter;

FIG. 9 illustrates in block diagram form a portion of the cosine FIR filter of FIG. 8 constructed in accordance with the principles of the present invention;

FIGS. 10a and 10b illustrate in schematic diagram form the cosine FIR filter portion shown in FIG. 9;

FIG. 11 illustrates in block diagram form an alternate arrangement of a portion of the cosine FIR filter of FIG. 8 constructed in accordance with the prnciples of the present invention;

FIGS. 12a, 12b and 12c illustrate in schematic diagram form the cosine FIR filter portion shown in FIG. 11; and FIG. 13 illustrates the response characteristic of the cosine FIR filter of FIGS. 8-12.

Referring to FIG. 1, a digital filter is illustatively shown in block diagram form. Input signals are applied to an input terminal 10 and pass through a series of delay stages, of which stages 12, 14, 16 and 18 are shown. A tap at the output of stage 12 is coupled to an input of a coefficient multiplier 22, which multiplies the tapped signal by a coefficient $C_1$. The output of the delay stage 18 is coupled to an input of a second coefficient multiplier 24, which multiplies the applied signal by a coefficient $C_2$. Outputs of the coefficient multipliers 22 and 24 are coupled to inputs of a combining circuit 20, which subtractively combines the signals applied to it.

To illustrate the principles of the present invention, it will be assumed that a triangular waveform signal 8 is digitized, applied to the input terminal 10 of the filter and is processed. A delayed version of the signal, A, is produced at the output of stage 12 and is multiplied by the weighting coefficient $C_1$, which in this example has a value of one-half. A further delayed signal, B, is produced at the output of stage 18 and is multiplied by the weighting coefficient $C_2$, which has a value of one-quarter in this example. The signal at the output of the combining circuit 20 will be of the form (A/2−B/4) with respect to delayed signals A and B at the outputs of stages 12 and 18.

Figure 2:
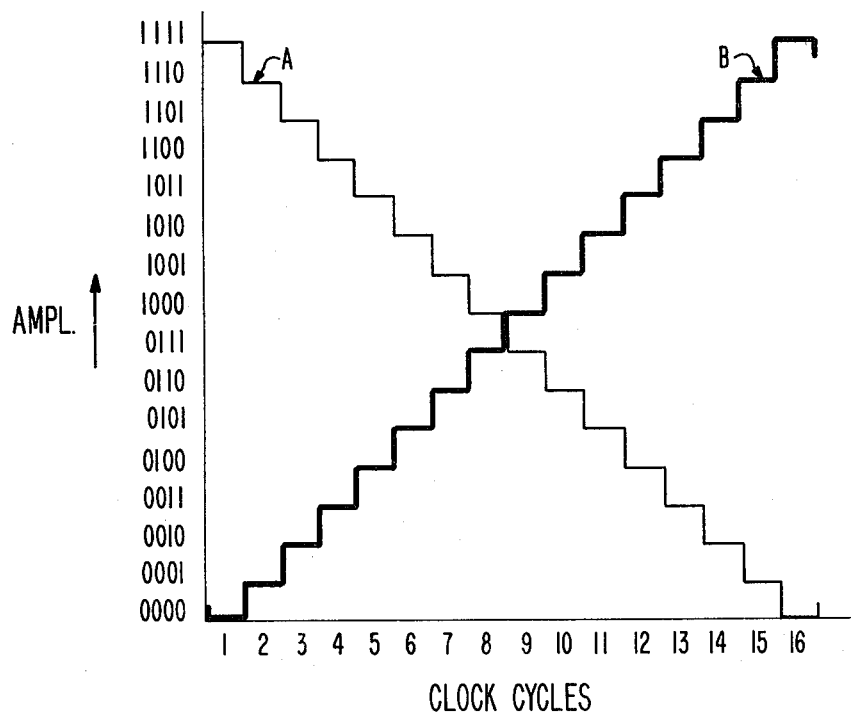
FIGS. 2 and 3 show waveforms illustrating the operation of the filter of FIG. 1 using binary data words.

Referring to FIG. 2, digitized waveforms A and B are shown. The exemplary waveforms of FIG. 2 will be obtained in response to input waveform 8 of FIG. 1 when the delay between the output of stage 12 and the output of stage 18 is equal to one-half period of the input waveform. Thus, waveform A will be declining from its maximum value of 1111 to its minimum value of 0000 at the same time that waveform B is increasing from 0000 to 1111. In this example, the waveforms A and B are quantized over the full dynamic range of a system of four-bit words, and are incremented or decremented over the full range in sixteen clock cycles. It is noted that the quantizing system is a four-bit binary word system, ranging from the minimum value of 0000 to the maximum of 1111.

Figure 3:
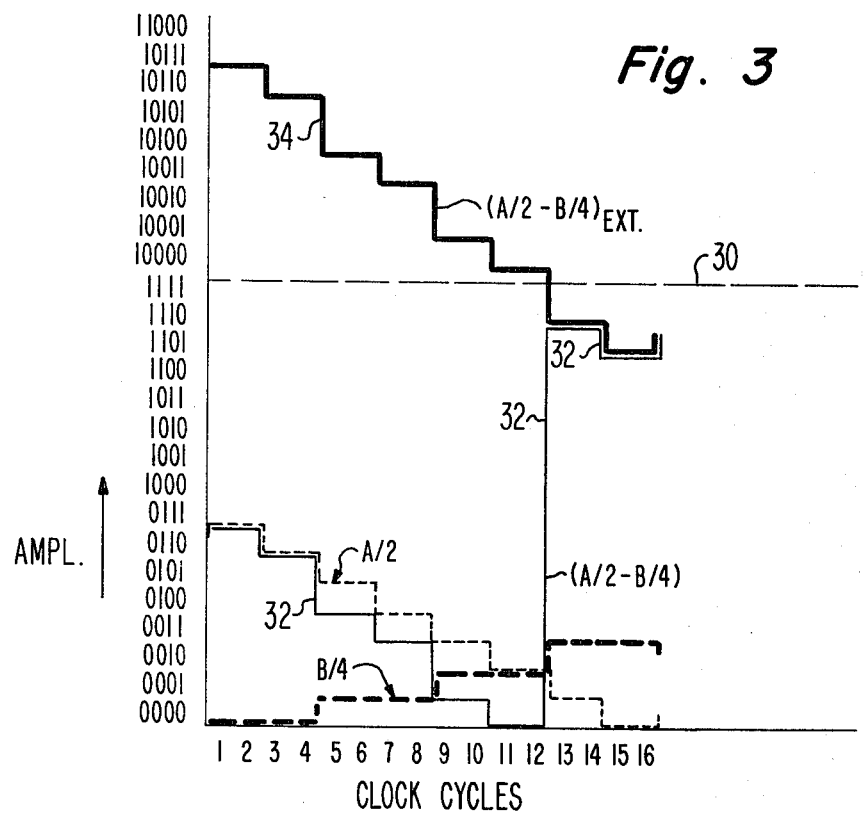

Now referring concurrently to FIG. 3, waveforms depicting the operation of the filter of FIG. 1 upon waveforms A and B of FIG. 2 are illustratively shown. Waveform A is multiplied by one-half by shifting the binary words representing the values of the levels of waveforms A by one bit position to the right. In order to keep the values within the confines of a four-bit system, bits shifted to the right of the four-bit word range, which would have fractional binary values, are discarded. This process results in the waveform A/2 shown in FIG. 3, which starts at a level of 0111 (which is 1111 shifted to the right by one bit) and declines to a value of 0000 at the fifteenth clock cycle. The roundoff error caused by discarding the out-shifted bits causes the A/2 signal to decline one incremental level every two clock cycles. That is, shifting 1111 and 1110 to the right by one bit results in a value of 0111 for both words.

In a similar manner, the words of the B waveform are multiplied by one-quarter by shifting each data word to the right by two places. In this case, the resultant B/4 waveform changes levels only every four clock cycles due to the roundoff error. That is, the words 0000, 0001, 0010 and 0011, when shifted right by two places, result in a value of 0000 in each instance.

Waveforms A/2 and B/4 are now subtractively combined to produce the desired results, (A/2−B/4). Subtraction of B/4 from A/2 is accomplished by two's complementing the B/4 data words and then adding the two's complemented words to the corresponding A/2 words. Two's complementing is achieved by inverting all of the bits of a data word, then incrementing the inverted word by one. For example, the value of B/4 over the first four clock cycles is 0000. To two's complement this value, the word is first inverted to produce 1111. This inverted word is then incremented by one to produce 10000. This two's complemented word is seen to be a five-bit word where the fifth bit, the most significant bit, is an overflow bit. This value is then added to the A/2 values (0111 and 0110) for the first four clock cycles to produce values of 10111 and 10110 for (A/2−B/4) over clock cycle intervals 1-2 and 3-4, respectively.

Calculated values of A/2, B/4, and the output of (A/2−B/4) are shown in Table 1, as well as graphically in FIG. 3. The output values for (A/2−B/4) are plotted as waveform 32, and are seen to descend from a value of 0111 during clock cycle intervals 1 and 2 to a value of 0000 in clock cycle intervals 11 and 12. These values are arrived at by ignoring the most significant bits of the output words of Table 1, which are overflow bits beyond the desired four-bit range. At the start of clock cycle interval 13, the output waveform 32 is seen to jump across almost the entire four-bit range as its experiences a transition from 0000 to 1110. The waveform then continues as before to a final value of 1101 at clock cycle 16.

The discontinuity exhibited by the signal 32 at the start of clock cycle interval 13 is due to the restriction of the dynamic range of the system to four bits, which ignores the overflow bit during clock cycles 1-12. When the dynamic range is increased to five bits, as shown above dashed line 30 in FIG. 3, the output values can be plotted as shown by waveform 34, in which the overflow bit is considered. In this extended range system $(A/2 - B/4)_{EXT}$ is seen to be a smoothly varying waveform from 10111 to 1101.

TABLE 1

| Clock Intervals | 1-2 | 3-4 | 5-6 | 7-8 |
|---|---|---|---|---|
| Binary A | 1111 | 1101 | 1011 | 1001 |
| A/2 | 0111 | 0110 | 0101 | 0100 |
| B | 0000 | 0010 | 0100 | 0110 |
| B/4 | 0000 | 0000 | 0001 | 0001 |
| $B/4\|_{TC}$ | 1111 | 1111 | 1110 | 1110 |
|  | +1 | +1 | +1 | +1 |
|  | 10000 | 10000 | 1111 | 1111 |

TABLE 1-continued

| A/2 | 0111 | 0110 | 0101 | 0100 |
|---|---|---|---|---|
| + B/4\|$_{TC}$ | 10000 | 10000 | 1111 | 1111 |
| Output | 10111 | 10110 | 10100 | 10011 |

| Clock Intervals | 9–10 | 11–12 | 13–14 | 15–16 |
|---|---|---|---|---|
| Binary A | 0111 | 0101 | 0011 | 0001 |
| A/2 | 0011 | 0010 | 0001 | 0000 |
| B | 1000 | 1010 | 1100 | 1110 |
| B/4 | 0010 | 0010 | 0011 | 0011 |
| B/4\|$_{TC}$ | 1101 | 1101 | 1100 | 1100 |
|  | +1 | +1 | +1 | +1 |
|  | 1110 | 1110 | 1101 | 1101 |
| A/2 | 0011 | 0010 | 0001 | 0000 |
| + B/4\|$_{TC}$ | 1110 | 1110 | 1101 | 1101 |
| Output | 10001 | 10000 | 01110 | 01101 |

TABLE 2

| Clock Intervals |  | 1–2 | 3–4 | 5–6 | 7–8 |
|---|---|---|---|---|---|
| Offset Two's | A | 0111 | 0101 | 0011 | 0001 |
| Complement | A/2 | 0011 | 0010 | 0001 | 0000 |
|  | B | 1000 | 1010 | 1100 | 1110 |
|  | B/4 | 1110 | 1110 | 1111 | 1111 |
|  | B/4\|$_{TC}$ | 0001 | 0001 | 0000 | 0000 |
|  |  | +1 | +1 | +1 | +1 |
|  |  | 0010 | 0010 | 0001 | 0001 |
|  | A/2 | 0011 | 0010 | 0001 | 0000 |
|  | + B/4\|$_{TC}$ | 0010 | 0010 | 0001 | 0001 |
|  | Output | 0101 | 0100 | 0010 | 0001 |
| Clock Intervals |  | 9–10 | 11–12 | 13– | 15–16 |
| Offset Two's | A | 1111 | 1101 | 1011 | 1001 |
| Complement | A/2 | 1111 | 1110 | 1101 | 1100 |
|  | B | 0000 | 0010 | 0100 | 0110 |
|  | B/4 | 0000 | 0000 | 0001 | 0001 |
|  | B/4\|$_{TC}$ | 1111 | 1111 | 1110 | 1110 |
|  |  | +1 | +1 | +1 | +1 |
|  |  | 10000 | 10000 | 1111 | 1111 |
|  | A/2 | 1111 | 1110 | 1101 | 1100 |
|  | +B/4\|$_{TC}$ | 10000 | 10000 | 1111 | 1111 |
|  | Output | 11111 | 11110 | 11100 | 11011 |

This is the desired output waveform shape, but it can only be produced by doubling the dynamic range of the system by extending the system to five bits. If the waveform 32 of FIG. 3 were a filtered video signal, with one end of the four-bit range representative of white-going signals and the other extreme black-going, waveform 32 would produce a sharp undesired discontinuity from black to white, or vice versa.

The undesired discontinuity of waveform 32 of FIG. 3 can be prevented without extending the dynamic range of a four-bit system by using a quantizing system for the filter of FIG. 1 known as an offset two's complement system. The binary system shown along the ordinate of FIG. 2 is converted to the offset two's complement system by inverting the most significant bit of each binary word to arrive at the quantizing system shown along the ordinate of FIG. 4. The result of this conversion is a quantizing system with a zero value at the midpoint of the original binary system and a symmetrical distribution of positive and negative values above and below this midpoint. The value $D_{OTC}$ of an offset two's complement data word is expressed as $$D_{OTC} = \left(\sum_{r=0}^{N-2} 2^r T_r\right) - 2^{N-1} T_{N-1}$$

where N is the number of bits in the word and the rth bit, $T_r$, is either 0 or 1.

When the A and B waveforms of FIG. 4 are quantized in the offset two's complement system and applied to the filter of FIG. 1, the waveforms of FIG. 5 are produced. The A/2 waveform is produced by shifting the data words of the A waveform of FIG. 4 one bit position to the right. The B/4 waveform is produced by shifting the data words of the B waveform two positions to the right. However, a special rule must be observed when shifting offset two's complemented words: the most significant bit positions which are vacated by the shift must be filled in by replication of the original most significant bit. For instance, when the B waveform word 1100 of clock cycle 5 of FIG. 4 is shifted to the right by two bit positions, the two most significant bit positions which are vacated by the shift are filled in with ones, the most significant bit of the original 1100 data word. As a result of the shifting and most significant bit replication, the B/4 data word in this case is 1111. This procedure is followed whether the most significant bit is a zero or a one.

As in the case of the waveforms of FIG. 3, the A/2 waveform of FIG. 5 changes levels every two clock cycles, and the B/4 waveform changes levels every four clock cycles due to the roundoff error.

The resultant output waveform of (A/2−B/4) is produced in FIG. 5 using the same procedure observed in FIG. 3. That is, the B/4 data words are two's complemented and added to the A/2 data words. Values for A/2, B/4, two's complemented B/4 (B/4|$_{TC}$) and the output values of (A/2−B/4) are shown in Table 2. The output values of the (A/2−B/4) function are seen to descend smoothly from a value of 0101 during the first two clock cycle intervals to a value of 1011 during the last two clock cycle intervals. The (A/2−B/4) waveform of FIG. 5 has the same form as waveform 34 of FIG. 3, but it does not extend beyond the dynamic range limits of the four-bit offset two's complement system.

Table 2 and FIG. 5 also show a further aspect of the offset two's complement filter: overflow bits in the filter which appear to require an extension of the quantization system by one bit may be safely ignored. For example, the output words produced during clock cycle intervals 9–16 in Table 2 all appear to be five-bit words. However, the most significant bits (overflow bits) of these words are ignored. The remaining four bits of each word are plotted in FIG. 5 as valid four-bit words to produce the desired (A/2−B/4) waveform.

FIG. 5 illustrates a significant feature of an offset two's complement filter. The three waveforms there shown are seen to be symmetrically located above and below the zero value midpoint of the quantizing system for the symmetrical input signal condition. Thus, the signals on the average can vary over half the dynamic range of the quantizing system above and below the midpoint value before an overflow or underflow condition will occur.

The principle of this feature is illustrated in FIGS. 6 and 7. In these FIGURES, smoothed analog waveforms are shown for ease of illustration. In FIG. 6, the waveform are quantized into the nine available binary levels shown along the ordinate of the drawing. The binary input signal $A_B$ is seen to vary over the full dynamic range of the binary quantizing system, from 1000 to 000. A $B_B$ input signal is not shown, but has the same amplitude as the $A_B$ input signal, and is phase shifted by 180 degrees. These two input signals, when weighted by coefficients of ½ and ¼, will produce the illustrated waveforms $A_{B/2}$ and $B_{B/4}$. When these two signals are subtractively combined, a signal of the form $(A_{B/2}-B_{B/4})$ is produced. This signal is seen to underflow the quantizing system between points $t_1$ and $t_2$, and $t_3$ and $t_4$. During these intervals, the resultant signal wraps around the register and reappears at the top of the FIG. as shown at 40 and 42. This is due to the fact that the input signals $A_B$ and $B_B$ and the intermediate waveforms $A_{B/2}$ and $B_{B/4}$ are all referenced to 000 at one end of the dynamic range of the quantizing system. Signals which attempt to go below the 000 reference level will thus wrap around and re-enter the quantizing system from the other extreme of the dynamic range.

Similar waveforms are shown in FIG. 7, quantized in the offset two's complement system. The input signals $A_{OT}$ and $B_{OT}$ (not shown) again occupy the full dynamic range of the system and are 180 degrees out of phase with respect to each other. The intermediate waveforms $A_{OT/2}$ and $B_{OT/4}$ are seen to vary symmetrically about the 000 midpoint value. The resultant $(A_{OT/2}-B_{OT/4})$ waveform also varies about the 000 midpoint but, unlike FIG. 6, this resultant waveform does not extend beyond the dynamic range limits of the quantizing system. The resultant waveform thus exhibits no discontinuities, and all waveforms are shown to be referenced to the 000 midpoint value at points $t_1$, $t_2$, $t_3$ and $t_4$.

Referring to FIG. 8, a linear phase digital cosine filter is shown in block diagram form. The filter includes eight parallel shift registers 50 which are all twenty-one stages long, with symmetrically weighted taps located about a center tap. The frequency response characteristic of the filter is a summation of cosine functions derived from the symmetrically weighted output taps, the signals of which are combined to represent the terms of a cosine series. The center taps at stages 11 of the shift registers provide a term in the series corresponding to a constant in the frequency domain which provides an amplitude offset for the response characteristic.

An eight-bit signal x(n) is applied to the inputs of the shift registers 50, with respective bits $b_0$31 $b_7$ applied to respective ones of the parallel shift registers. The eight first stages 1 include output taps coupled in parallel to the input of a weighting function circuit 61. In FIG. 8, a broad arrow represents a plurality of parallel signal paths. Similarly, stages 5, 9, 11, 13, 17 and 21 are coupled to the inputs of weighting function circuits 62, 63, 52, 64, 65 and 66, respectively. Weighted signals at the outputs of weighting function circuits 63 and 64 are applied to the inputs of an adder 70, the output of which is coupled to an input of an adder 56. The outputs of weighting function circuits 62 and 65 are coupled to inputs of an adder 72, the output of which is coupled to an input of an adder 58. The outputs of weighting function circuits 61 and 66 are coupled to inputs of an adder 74, the output of which is coupled to a second input of adder 58. The output of adder 58 is coupled to a second input of adder 56, the output of which is coupled to an input of adder 54. The output of the center tap weighting function circuit 52 is coupled to a second input of the adder 54. A filtered output signal is produced at the output of the final adder 54.

In operation, progressively delayed data words are tapped at respectively delayed stages, weighted, and applied to a ladder network of adders, which combines the tap-weighted signals. Taps located symmetrically with respect to the center stages 11 are equally weighted and applied to the same first adder in the ladder network. For instance, signals at stage locations 9 and 13, referred to as A and B, are both weighted by a factor of 5/16. The weighted signals (5/16)A and (5/16)B are both applied to adder 70, which produces a summed signal (5/16) (A+B). Similar weighting is applied to signals C, D, E, F, and K. All of the tap-weighted signals about the center tap 11 are eventually summed at the output of adder 56, which exhibits a normalized filter response characteristic dependent upon the tap locations and weights. This normalized response is then offset by the center tap weight value in adder 54 to produce the desired output response characteristic.

It is possible to reduce the number of weighting function circuits 61-66 of FIG. 8 because of the symmetrical nature of the tap spacing and the tap weight values. That is, since the two tapped signal paths connected to each of adders 70, 72 and 74 in FIG. 8 are weighted by the same value (e.g., 5/16, $-7/64$ or 3/64), the tapped signals may be combined and the sum weighted. For example, tapped signals A and B may be applied directly to adder 70 as shown in FIG. 9, which produces the sum signal (A+B). This sum signal is then weighted to produce the desired signal function 5/16(A+B), the same as obtained in the arrangement of FIG. 8. Similarly, signals C and D, and signals E and F, are combined in FIG. 9 by adders 72 and 74, and the sum signals (C+D) and (E+F) are then weighted.

In the FIR filter of FIG. 8, the weighting function values are all seen to be multiples of negative powers of two. This permits the weighting function circuits to be constructed as shift-and-add multipliers, in which the sum signals are first shifted to divide them by the appropriate powers of two, then added or subtracted to form the desired weighting function. For instance, the 5/16 value of weighting function circuits 63 and 64 may be produced by dividing the (A+B) signal by four and by sixteen, then adding the shifted signals, which produces $(\frac{1}{4})(A+B)+(1/16)(A+B)=(\frac{1}{4}+1/16)(A+B)$, which is equal to (5/16)(A+B), the desired result.

The ladder network of FIG. 8 is shown in block diagram form in the embodiment of FIG. 9, using shift-and-add multipliers. The A and B signals are applied to adder 70 to produce the sum signal (A+B). The (A+B) signal is applied to a divide-by-four circuit 81 and a divide-by-sixteen circuit 82. The outputs of dividers 81 and 82 are coupled to inputs of an adder 83, which produces an output signal of the form (5/16)(A+B). The output of adder 83 is coupled to an input of adder 56 by way of an offset two's complement (OTC) transform circuit 89.

The C and D signals are summed in adder 72, the output of which is coupled to the input of a circuit 80, which transforms the (C+D) signal into offset two's complement notation. The output of the OTC transform circuit 80 is coupled to the inputs of a divide-by-eight circuit 84 and a divide-by-sixty-four circuit 85. The output of the divider 85 is coupled to the input of a one's complement circuit 86. The outputs of the divider 84 and the one's complement circuit 86 are coupled to the inputs of an adder 87. The output of the adder 87 is coupled to the input of a second one's complement circuit 88, the output of which is coupled to an input of an adder 58.

The E and F signals are summed by adder 74, and the sum signal is applied to the input of a third offset two's complement circuit 90. The output of circuit 90 is coupled to the inputs of a divide-by sixteen circuit 91 and a divide-by-sixty-four circuit 92. The output of the divide-by-sixty-four circuit is coupled to the input of a one's complement circuit 93. The outputs of divider 91 and one's complement circuit 93 are coupled to inputs of an adder 94. The output of adder 94 is coupled to the second input of adder 58.

The output of adder 58 is coupled to a second input of adder 56, the output of which is coupled to an input of adder 54 by way of a circuit 96, which converts the OTC output of adder 56 to binary notation. The K signal is coupled to a second input of adder 54 by way of a divide-by-two circuit 52. An output signal y(n) is produced at the output of adder 54.

The weighted function $(-7/64)(C+D)$ is developed from the $(C+D)$ sum signal in a two step procedure. First, $(\frac{1}{8})(C+D)$ is produced by divider 84 and is added to $(-1/64)(C+D)$ in adder 87. The latter term is produced by dividing the $(C+D)$ sum signal by sixty-four in divider 85, then two's complementing the result by the one's complement circuit 86 and the carry-in bit of adder 87. The output signal of adder 87 is then in a form of $(7/64)(C+D)$. This output signal is then subtracted from the output of adder 94 in adder 58, using one's complement circuit 88 and the carry-in bit of adder 58, causing the output signal of adder 58 to include a term of the form $(-7/64)(C+D)$.

Similarly, the function $(3/64)(E+F)$ is produced by combining $(1/16)(E+F)$ (which is produced by divider 91) with $(-1/64)(E+F)$ which is produced by divider 92, one's complement circuit 93, and the carry-in bit of adder 94) in adder 94. This signal is then applied to adder 58.

The adder 58 will produce an output signal which can be either positive or negative, depending upon the relative magnitudes of the $(C+D)$ and $(E+F)$ sums. For instance, if $(C+D)$ is equal to $(E+F)$, then the output of adder 58 will be $(-4/64)(C+D)=(-4/64)(E+F)$, since
$(-7/64)(C+D)$ has a greater magnitude negative value than the positive value of $(3/64)(E+F)$. As a second example, suppose that $(E+F)$ is three times the magnitude of $(C+D)$. The output of adder 58 is then equal to $(-7/64)(C+D)+3(3/64)(C+D)=(2/64)(C+D)$ which is a positive value dominated by the $(3/64)(E+F)$ term.

Since the sign of the output signal of adder 58 is dependent upon the magnitude of the input data and therefore indeterminate, adder 58 is operated using offset two's complement numbers to guard against underflows and resultant number system wrap-arounds, which would occur with binary numbers. The offset two's complement transform circuits 80 and 90 are therefore coupled ahead of adder 58 in the two signal paths leading to that adder. The transform circuits 80 and 90 are shown coupled ahead of the adders 87 and 94, which also perform subtraction, but are not needed for these adders because their output signal signs are determinate. This is because both signal paths to the adders originate from a common data word, and a lesser magnitude value is always subtracted from a greater magnitude value. Adder 87, for instance, is always performing the function $(\frac{1}{8})(C+D)-(1/64)(C+D)$ which is always dominated by the minuend $(\frac{1}{8})(C+D)$. Likewise, adder 94 is always producing a term equal to $(1/16)(E+F)-(1/64)(E+F)$ which is also dominated by the minuend $(1/16)(E+F)$. Offset two's complementing is therefore unnecessary for these adders, but may be used if desired to put the data words in the form required for correct operation of adder 58.

It is not desirable to use offset two's complement numbers throughout the filter of FIG. 9, however. For instance, adders 70, 72 and 74 each adds to eight bit numbers. The resultant sum must be a nine bit number, to prevent overflows when the two summed words are at or near their maximum values. This is true whether the words are offset two's complement words or binary words. When the words are in offset two's complement form, the adder input words must be expanded by most significant bit (MSB) replication to nine bits, since offset two's complement addition requires the lengths of the input words to be equal to or greater than the length of the output word. This would require adders 70, 72 and 74 to be capable of accepting nine bit input words. Adders, however, are conventionally available in multiples of four bits. A typical adder, such as those used in this example, will accept two eight bit input words and produce nine output bits, including a carry out bit as the MSB. Thus, adders 70, 72 and 74 may be conventional eight bit adders when operated with binary numbers, and will add two eight bit input words to produce a nine bit output word. The ninth bit is derived from the conventionally available "carry out" output of each adder. The use of binary data words instead of offset two's complement words therefore results in a hardware savings in adders 70, 72 and 74.

A similar hardware savings may be obtained by operating adder 54 with binary numbers instead of offset two's complement numbers. The output of adder 56 is converted back to binary notation by binary converter 96, and adder 56 therefore will add two binary words to produce an eight bit output word. When this eight bit output word is added to the seven bit K/2 word in adder 54, a nine bit output word is needed to prevent overflows of this adder. The use of binary data in adder 54 therefore alleviates the need to expand adder 54 to accept nine bit input words, which would be necessary if adder 54 were operated with offset two's complement words.

Adder 56 in this embodiment must be operated using offset two's complement numbers to prevent overflows of its output to nine bits. This is because the output of adder 58 is in OTC form, with data words centered about the middle of a seven bit word system. If the output of adder 58 were converted to a binary form, the minimum value of any output word will be above the zero reference level of the binary numbering system, which causes the words to have larger than necessary absolute magnitudes. When added to the binary output of adder 83, the output word is subject to overflowing into a nine bit numbering system, which would cause wrap-arounds in an eight-bit system. These overflows are prevented by vonverting the output of adder 83 to offset two's complement form, ensuring that the output of adder 56 will not exceed words of eight-bit length.

The arrangement of FIG. 9 is shown schematically in FIGS. 10a and 10b. In FIG. 10a, the eight bit C and D data words are applied to adder 72, which produces a nine bit sum word (C+D) at outputs $\Sigma_0 - \Sigma_{co}$, where $\Sigma_{co}$ is the carry out bit. The sum word is divided by eight by applying only the six most significant bits $\Sigma_3 - \Sigma_{co}$ to the least significant inputs $a_0 - a_5$ of adder 87. The MSB $\Sigma_{co}$ is inverted by inverter 80 to convert the word to offset two's complement notation.

The (C+D) sum word is divided by sixty-four by applying only the three most significant bits $\Sigma_6 - \Sigma_{co}$ to the least significant bit inputs $b_0 - b_2$ of the adder 87. The $b_0 - b_2$ input word to adder 87 is converted to offset two's complement form and is one's complemented for subtraction by inverting bits $\Sigma_6$ and $\Sigma_7$ by inverters 86 and 86' and not inverting the MSB $\Sigma_{co}$. The MSB, $\Sigma_{co}$, is replicated into inputs $b_3$, $b_4$ and $b_5$ of adder 87 for proper offset two's complement addition. A logical "1" is applied to the carry-in input CI of the adder to convert the one's complemented word to a two's complemented word. Adder 87 will thus perform the function of $(\frac{1}{8})(C+D) - (1/64)(C+D)$ which produces an output word of the form $(7/64)(C+D)$. This output word is confined to the lower six output bits $\Sigma_0 - \Sigma_5$ of adder 87 because 7/64 is less than one-eight of the nine bit words (C+D).

Adder 74 functions like adder 72 to add eight bit words E and F, which produces a nine bit sum word (E+F). The five most significant bits of the (E+F) sum word are applied to inputs $a_0 - a_4$ of adder 94, with the MSB inverted by inverter 90, to produce $(1/16)(E+F)$ in offset two's complement form. The three most significant bits of the (E+F) word are also applied to adder 94 to provide a word of the form $(1/64)(E+F)$. This word is subtracted from $(1/16)(E+F)$ in adder 94 by two's complementing it through inversion of bits $\Sigma_6$ and $\Sigma_7$ by inverters 93 and 93' and carrying in a logical "1" to the CI input of adder 94. The MSB $\Sigma_{10}$ is not inverted so that the two's complemented word is in offset two's complement form. The MSB applied to input $b_2$ of the adder 94 is replicated into the higher order inputs $b_3$ and $b_4$ for proper offset two's complement addition. Adder 94 thus performs the function of $(1/16)(E+F)-(1/64)(E+F)$, which produces an output word of the form $(3/64)(E+F)$. This output word is contained within the lower five output bits $\Sigma_0 - \Sigma_4$ of adder 94, since 3/64 is less than one-sixteenth of the nine bit word (E+F).

Adder 58 is then used to subtract $(7/64)(C+D)$ from $(3/64)(E+F)$, which provides the minus sign for the $(-7/64)$ weighting function term. The output word of adder 87 is two's complemented by inverters 88 and the logical "1" carry in bit applied to input CI of adder 58. The MSB is replicated into input $a_6$ of adder 58. The output word of adder 94 is applied to the "b" inputs of adder 58, with the MSB replicated into inputs $b_5$ and $b_6$. Adder 58 produces an output word of the form $(-7/64)(C+D)+(3/64)(E+F)$. This output word is contained in seven output bits $\Sigma_0 - \Sigma_6$ because it is the sum of $|7/64|$ plus $|3/64|$ of a nine bit word, which is equal to $|10/64|$ of a nine bit word. Since 10/64 is less than one-quarter, the word will never exceed seven bits. This output word is applied to the "b" inputs of adder 56, shown in FIG. 10b.

In FIG. 10b, adder 70 adds the A and B words to produce the sum word (A+B). The seven most significant bits of this sum word are applied to inputs $a_0 - a_6$ of adder 83, to form $(\frac{1}{4})(A+B)$ at these inputs. Similarly, the five most significant bits of the sum word (A+B) are applied to inputs $b_0 - b_4$ of adder 83, forming $(1/16)(A+B)$ at the "b" inputs. These two binary words are added to produce an eight bit output word of the form $(5/16)(A+B)$. This output word is converted to offset two's complement form by inverting the MSB $\Sigma_7$ by inverter 89. The converted word is then added to the binary word from adder 58 in adder 56 to produce an eight bit output word denoted "cosine sum". This word is contained in eight bits since it is the sum of $$|5/16| + |7/64| + |3/64| = |30/64|$$

of a nine bit word. Since 30/64 is less than one-half, the cosine sum word is contained within eight bits, which is one-half of a nine bit word.

The eight bit cosine sum word is converted to binary form by inverting the MSB $\Sigma_7$ of adder 56 by inverter 96. The binary word is then added to $(\frac{1}{2})K$ in adder 54 by applying the cosine sum word to the "a" inputs of the adder and the seven most significant bits of the K word to the $b_0 - b_6$ inputs of the adder. The resultant output word y(n) is contained within nine bits because the cosine sum word can have a maximum magnitude of one-quarter of a nine bit word system, which is the midpoint of an eight-bit word (and the center of an offset two's complement eight-bit word), plus one-half of its maximum magnitude of $|30/64|$, or $|16/64| + (\frac{1}{2})|30/64| = |31/64|$. The eight-bit K word is divided by two and thus can have a maximum magnitude of $|\frac{1}{4}|$ of a nine-bit number range. The maximum magnitude of the y(n) output word is thus equal to $$|31/64| + |16/64| = |47/64|$$

of a nine-bit number range. Since 47/64 is greater than one-half, nine bits are needed for the y(n) output word.

An alternative embodiment of the FIR filter of FIG. 8 is shown in block diagram form in FIG. 11. In this embodiment, the weighting function values are comprised of a summation of inverse powers of two ($\frac{1}{2}$, $\frac{1}{4}$, $\frac{1}{8}$, 1/16, 1/32, 1/64), as was done in the arrangement of FIG. 9. The weighting function values are then grouped into a set of positive values and a set of negative values. The positive values are all summed together and the negative values are all summed together, which may be done in binary notation. The two sums are then converted to offset two's complement form, and the sum of the negative values is subtracted from the sum of the positive values to produce the filter output signal.

In FIG. 11, as in the arrangement of FIG. 9, adders 70, 72 and 74 receive signals A and B, signals C and D, and signals E and F, respectively, in binary form. The y(n) output signal is again of the form $$y(n) = \frac{K}{2} + \frac{5}{16}(A+B) - \frac{7}{64}(C+D) + \frac{3}{64}(E+F)$$

This expression may be further broken down into inverse power of two functions $$y(n) = \frac{K}{2} + \frac{1}{4}(A+B) + \frac{1}{16}(A+B) - \frac{1}{8}(C+D) + \frac{1}{64}(C+D) + \frac{1}{16}(E+F) - \frac{1}{64}(E+F)$$

Rearranging these terms into groups of positive and negative values results in $$y(n) = \left[ \frac{K}{2} + \frac{1}{4}(A + B) + \frac{1}{16}(A + B) + \frac{1}{64}(C + D) + \frac{1}{16}(E + F) \right] - \left[ \frac{1}{8}(C + D) + \frac{1}{64}(E + F) \right]$$

which is the subtraction provided by the final adder in the filter. By configuring the filter in this manner, offset two's complement conversion is necessary only at the inputs to the final adder, which performs the only subtraction in the filter.

In the embodiment of FIG. 11, dividers 81 and 82 and adder 83 receive the (A+B) sum word to produce an output signal of the form (5/16)(A+B), as was done in the arrangement of FIG. 9. The (C+D) sum word is again divided by eight and sixty-four by dividers 84 and 85, and the (E+F) sum word is again divided by sixteen and sixty-four by dividers 91 and 92. Since dividers 84 and 92 produce negative terms in the final output signal, their outputs are added together by an adder 116 to produce an output of the form $(\frac{1}{8})(C+D)+(1/64)(E+F)$. The positive terms produced by dividers 85 and 91 are added together by an adder 114 to produce an output of the form (1/64)(C+D)+(1/16)(E+F). The output of adder 114 is coupled to an input of an adder 112, where the positive term (5/16)(A+B) is summed with the output word of adder 114. The output of adder 112 is coupled to an input of an adder 110, where the sum word is combined with the K/2 term. The output of adder 110 contains all of the positive terms of the filter, and is equal to $$\frac{K}{2} + \frac{5}{16}(A + B) + \frac{1}{64}(C + D) + \frac{1}{16}(E + F)$$

The output of adder 116, containing the sum of the negative filter terms, is then subtracted from the sum of the positive terms in adder 100. The outputs of adders 110 and 116 are converted to offset two's complement form by circuits 102 and 104, respectively. The output of circuit 104 is then one's complemented by inverter 106 and applied to adder 100 along with a carry in "one" to effectively two's complement the output of circuirt 104. The output of circuit 102 is also coupled to an input of adder 100, which produces the y(n) output signal in offset two's complement form using only a single, final subtraction step.

The arrangement of FIG. 11 is shown schematically in FIGS. 12a, 12b and 12c. In FIG. 12a, eight bit words C and D are added in adder 72 to produce a nine bit sum word (C+D). The six most significant bits of the (C+D) sum word are applied to the six least significant bit "a" inputs of adder 116 to effectively apply $(\frac{1}{8})(C+D)$ to the adder 116. The three most significant bits of the (C+D) sum word are applied to the three least significant bit "a" inputs of adder 114, effectively applying (1/64)(C+D) to adder 114.

Adder 74 sums eight bit words E and F to produce a nine bit sum word (E+F). The three most significant bits of the (E+F) sum word are applied to the three least significant bit "b" inputs of adder 116, which provides an input word of the form (1/64)(E+F). Adder 116 thus produces a seven bit output word of the form $[(\frac{1}{8})(C+D)+(1/64)(E+F)]$.

The five most significant bits of the (E+F) sum word are applied to the five least significant "b" inputs of adder 114. Adder 114 produces a six bit output word of the form (1/64)(C+D)+(1/16)(E+F).

In FIG. 12b, adders 70 and 83 are coupled in the same manner as shown in FIG. 10b to produce an eight bit output word at the outputs of adder 83 of the form (5/16)(A+B). The outputs of adder 83 are coupled to the "a" inputs of adder 112, and the outputs of adder 114 are coupled to the six least significant bit "b" inputs of adder 112. Adder 112 produces an eight bit output word of the form (5/16)(A+B)+(1/64)(C+D)+(1/16)(E+F).

In FIG. 12c, adder 110 receives the eight bit output word of adder 112 at its "a" inputs, and the seven most significant bits of the K word at inputs $b_0-b_7$. Adder 110 produces a nine bit output word which is the sum of the positive filter functions and is of the form K/2+(5/16)(A+B)+(1/64)(C+D)+(1/16)(E+F).

The most significant bit of this nine bit word, $\Sigma_{co}$ of adder 110, is inverted by inverter 102 to convert the word to offset two's complement form. The output of inverter 102 is coupled to input $a_8$ of nine-bit adder 100, and outputs $\Sigma_0-\Sigma_7$ of adder 110 are coupled to inputs $a_0-a_7$ of adder 100, respectively.

Outputs $\Sigma_0-\Sigma_5$ of adder 116 are coupled to inputs of inverters shown at 106, the outputs of which are coupled to inputs $b_0-b_5$ of adder 100. The most significant bit $\Sigma_6$ of the output of adder 116 is applied directly to input $b_6$ of adder 100 so that the "b" inputs of adder 100 are receiving a one's complemented form of the output of adder 116 in offset two's complement notation. The MSB $\Sigma_6$ is also replicated into inputs $b_7$ and $b_8$ of adder 100. A logical "1" is applied to the carry in input of adder 100 to two's complement the one's complemented output of adder 116 for subtraction. Adder 100 will then produce an output word, y(n) of the desired form of $$[K/2 + (5/16)(A + B) + (1/64)(C + D) + (1/16)(E + F)] - [(\tfrac{1}{8})(C + D) + (1/64)(E + F)] = K/2 + (5/16)(A + B) + (7/64)(C + D) + (3/64)(E + F)$$

The arrangement of FIGS. 12a, 12b and 12c, in which positive and negative terms are separately summed in the positive sense and the two resulting sums subtracted, is seen to use nine adders and seven inverters, compared with the use of nine adders and fourteen inverters in the arrangement of FIGS. 10a and 10b. If desired, the nine-bit adder 100 of FIG. 12c can be replaced with a conventional eight-bit adder by truncating or rounding off its two input words to eight bits.

The FIR filter arrangements of FIGS. 8-12 will produce a response characteristic as shown in FIG. 13 when the shift register 50 is clocked at approximately 14.3 MHz. The characteristic response exhibits six dB points at approximately 1.8 and 5.3 MHz, which is a desirable characteristic for a low pass luminance or vertical detail filter in a television receiver in the NTSC system. The characteristic response can be simply inverted to provide a desirable response for an NTSC chrominance bandpass filter by subtractively combining the cosine sum term with the K/2 term. This is accomplished by subtracting the output of adder 56 from the K/2 term in adder 54 of FIGS. 8, 9 or 10b using the two's complement of the cosine sum term in offset two's complement form as described above.

What is claimed is:

1. A digital filter for processing a binary signal, said filter including delay stages for producing delayed replicas of said binary signal at a plurality of output taps, said filter further comprising:
a plurality of weighting function circuits having inputs coupled to respective ones of said output taps for producing weighted binary signals;
a plurality of adders coupled in a ladder network to additively and subtractively combine said weighted signals to produce a filtered digital output signal, said additively combining adders each being responsive to two of said weighted signals in binary form for producing digital sum signals in binary form, and said subtractively combining adders each being responsive to two of said weighted signals, one of which is in two's complement form, for producing digital difference signals; and
means, coupled in series with the inputs of each of said subtractively combining adders, for converting the weighted signals applied thereto to offset two's complement form;
whereby digital additions are performed in binary form and digital subtractions are performed in offset two's complement form.

2. A digital filter for processing a binary signal including means responsive to said binary signal for producing delayed replicas of said binary signal at a plurality of output taps, and a ladder network of weighting function circuits and adders coupled to said output taps for weighting and combining said delayed signals, comprising:
a first adder having first and second inputs coupled to different ones of said output taps, and an output at which a first binary sum signal is produced;
first means having an input and an output, and coupled to the output of first adder for weighting said first binary sum signal by a given weighting factor;
means coupled to said first weighting means for converting said first binary sum signal to offset two's complement form;
a second adder having first and second inputs coupled to different ones of said output taps, and an output at which a second binary sum signal is produced;
second means coupled to the output of said second adder for weighting said second binary sum signal by a given weighting factor;
means serially coupled with said second weighting means for converting said second binary sum signal to offset two's complement form;
means for two's complementing said first offset two's complemented weighted sum signal; and
a third adder having inputs coupled to receive said two's complemented first offset two's complemented weighted sum signal and said second offset two's complemented weighted sum signal, and an output at which a difference signal is produced.

3. The digital filter of claim 2, wherein said means for converting said first weighted binary sum signal to offset two's complement form is coupled to the input of said first weighting means.

4. The digital filter of claim 2, wherein said means for converting said first weighted binary sum signal to offset two's complement form is coupled to the output of said first weighting means.

5. The digital filter of claim 2, further comprising:
third means having an output, and an input coupled to one of said output taps for weighting the binary signal produced thereat;
means, coupled to the output of said third adder, for converting received digital signals to binary form; and
a fourth adder, having inputs coupled to the output of said third weighting means and said means coupled to the output of said third adder, for producing an output sum signal.

6. A digital filter for processing a binary signal including means responsive to said binary signal for producing delayed replicas of said binary signal at a plurality of output taps, and a ladder network of weighting function circuits and adders coupled to said output taps for weighting said delayed binary signals and combining said weighted signals, comprising:
a first signal path having an input coupled to a first one of said output taps and an output at which a first weighted digital signal in offset two's complement form is produced, including a first weighting function circuit for weighting applied digital signals, and means for converting digital signals in said first path to offset two's complement form;
a second signal path having an input coupled to a second one of said output taps and an output at which a second weighted digital signal in offset two's complement form is produced, including a second weighting function circuit for weighting applied digital signals, and means for converting digital signals in said second path to offset two's complement form;
means coupled to the output of said second signal path, for producing a two's complemented version of said second weighted digital signal;
a first adder having a first input coupled to the output of said first signal path, a second input coupled to receive said two's complemented version of said second weighted digital signal, and an output at which a digital signal representative of the difference between said first and second weighted digital signals is produced;
a third signal path having an input coupled to one of said output taps and an output at which a third weighted digital signal in binary form is produced, including a third weighting function circuit for weighting applied digital signals;
a second adder having a first input coupled to the output of said third signal path, a second input and an output at which a digital signal in binary form is produced; and
means for converting offset two's complemented signals to binary form coupled between the output of said first adder and the second input of said second adder.

7. The digital filter of claim 6, wherein said weighting function circuits weight said applied digital signals by weighting function values equal to multiples of negative powers of two.

8. The digital filter of claim 7, wherein said two's complemented version producing means includes means for applying a logical "one" as a carry-in bit to said first-named adder.

9. The digital filter of claim 6, wherein said means for converting digital signals in said second path to offset two's complement form and said means for producing a two's complemented version of said second weighted digital signal comprises a plurality of inverters coupled to invert all bits except the most significant bit of said digital signals weighted by said second weighted function circuit, and means for applying a logical "one" as a carry-in bit to said first-named adder.

10. A digital filter for processing binary signals, comprising:
    means responsive to said binary signals for producing delayed replicas of said binary signals at a plurality of output taps;
    a plurality of binary signal processing paths coupled to ones of said output taps for producing weighted delayed binary signals;
    a first ladder network of adders coupled to a first plurality of said signal paths, and having an output at which a first sum of weighted delayed binary signals is produced;
    a second ladder network of adders coupled to a second plurality of said signal paths, and having an output at which a second sum of weighted delayed binary signals is produced;
    means for converting said first and second sums to offset two's complement form;
    means responsive to said second offset two's complement sum for producing a two's complemented replica of said second offset two's complement sum; and
    an adder having a first input coupled to receive said first sum in offset two's complement form, and a second input coupled to receive said two's complement second sum in offset two's complement form, and an output at which a filtered digital signal is produced.

11. A digital filter for processing a binary signal number, where negative numbers are represented in two's complemented format, including means for producing delayed replicas of said binary signal at a plurality of output taps, and a ladder network of weighting function circuits and adders coupled to said output taps for weighting and combining said delayed binary signals, said ladder network including at least one subcircuit having weighting and combining circuits connected between two of said plurality of output taps and an output terminal thereof for serially processing binary signals available at said two of said plurality of output taps, comprising:
    offset two's complementing means;
    signal weighting means;
    signal adding means; and
    respective means for serially coupling said offset two's complementing, weighting and adding means to process signals applied to said subcircuit, and produce at said output terminal, an offset two's complemented, summed and weighted manifestation of signals available from said output taps.

* * * * *

UNITED STATES PATENT AND TRADEMARK OFFICE
CERTIFICATE OF CORRECTION

PATENT NO. : 4,430,721
DATED : Feb. 7, 1984
INVENTOR(S) : A. Acampora

It is certified that error appears in the above-identified patent and that said Letters Patent is hereby corrected as shown below:

| | |
|---|---|
| Col. 3, line 66 | "waveforms" should be --waveform--. |
| Col. 5, line 29 | "13--" should be --13-14--. |
| Col. 7, line 41 | "$b_0 31 b_7$" should be --$b_0$-$b_7$--. |
| Col. 10, line 66 | "vonverting" should be --converting--. |
| Col. 12, line 40 | "(1/2, 1/4, 1/2," should be --(1/2, 1/4, 1/8,--. |
| Col. 13, line 60 | "(1/2)" should be --(1/8)--. |
| Col. 14, line 2 | "[(1/2)" should be --[(1/8)--. |

Signed and Sealed this

Nineteenth Day of June 1984

[SEAL]

Attest:

GERALD J. MOSSINGHOFF

Attesting Officer

Commissioner of Patents and Trademarks